(12) United States Patent
Watanabe

(10) Patent No.: US 7,940,531 B2
(45) Date of Patent: *May 10, 2011

(54) DC-DC CONVERTER

(75) Inventor: Mitsuhiro Watanabe, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/622,169

(22) Filed: Nov. 19, 2009

(65) Prior Publication Data

US 2010/0061071 A1    Mar. 11, 2010

Related U.S. Application Data

(63) Continuation of application No. 12/091,601, filed as application No. PCT/JP2006/321682 on Oct. 30, 2006, now Pat. No. 7,646,610.

(30) Foreign Application Priority Data

Oct. 28, 2005  (JP) ................................. 2005-314649

(51) Int. Cl.
  H05K 7/02  (2006.01)
  H05K 7/06  (2006.01)
  H05K 7/08  (2006.01)
  H05K 7/10  (2006.01)

(52) U.S. Cl. ......... 361/760; 361/764; 361/795; 336/234

(58) Field of Classification Search .......... 361/782–795; 336/19, 199–200, 234

See application file for complete search history.

(56) References Cited

U.S. PATENT DOCUMENTS

| 4,730,241 | A | * | 3/1988 | Takaya ............................ 363/19 |
| 4,845,452 | A | | 7/1989 | Sasaki et al. |
| 5,225,969 | A | | 7/1993 | Takaya et al. |
| 6,597,270 | B2 | | 7/2003 | Takashima et al. |
| 6,885,278 | B2 | | 4/2005 | Nakao et al. |
| 2005/0116695 | A1 | | 6/2005 | Morioka |

FOREIGN PATENT DOCUMENTS

| JP | 64-064240 A | 3/1989 |
| JP | 08-088474 A | 4/1996 |
| JP | 2000-331835 A | 11/2000 |
| JP | 2002-233140 A | 8/2002 |
| JP | 2004-063676 A | 2/2004 |

(Continued)

*Primary Examiner* — Tuan T Dinh
(74) *Attorney, Agent, or Firm* — Sughrue Mion, PLLC

(57) ABSTRACT

A DC-DC converter comprising a soft-magnetic, multi-layer substrate provided with a laminated coil constituted by connecting pluralities of conductor lines, and a semiconductor integrated circuit device comprising a switching device and a control circuit, which are mounted on the soft-magnetic, multi-layer substrate; the semiconductor integrated circuit device comprising an input terminal, an output terminal, a first control terminal for controlling the ON/OFF of the switching device, a second control terminal for variably controlling output voltage, and pluralities of ground terminals; the soft-magnetic, multi-layer substrate comprising first external terminals formed on a first main surface, first connecting wires formed on the first main surface and/or on nearby layers, second connecting wires formed between the side surface of the multi-layer substrate and a periphery of the laminated coil, and second external terminals formed on a second main surface; and terminals of the semiconductor integrated circuit device being connected to the first external terminals on the multi-layer substrate, at least part of the first external terminals being electrically connected to the second external terminals through the first and second connecting wires, and the input or output terminal being connected to the second external terminals via the laminated coil.

8 Claims, 15 Drawing Sheets

FOREIGN PATENT DOCUMENTS

| | | |
|---|---|---|
| JP | 2004-186312 A | 7/2004 |
| JP | 2005-124271 A | 5/2005 |
| JP | 2005-168106 A | 6/2005 |
| JP | 2005-183890 A | 7/2005 |

* cited by examiner

Fig. 30
CONVENTIONAL
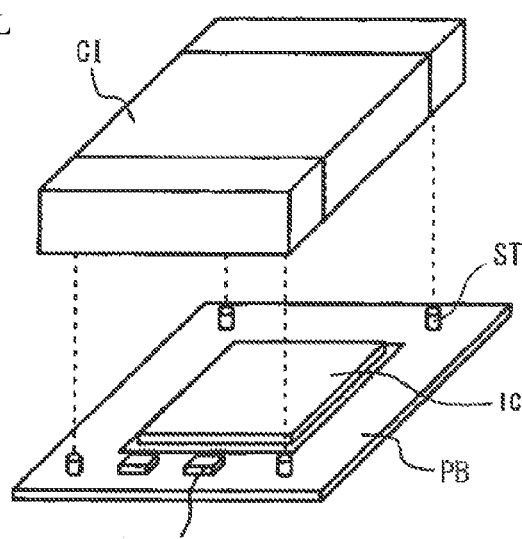

Fig. 31
CONVENTIONAL
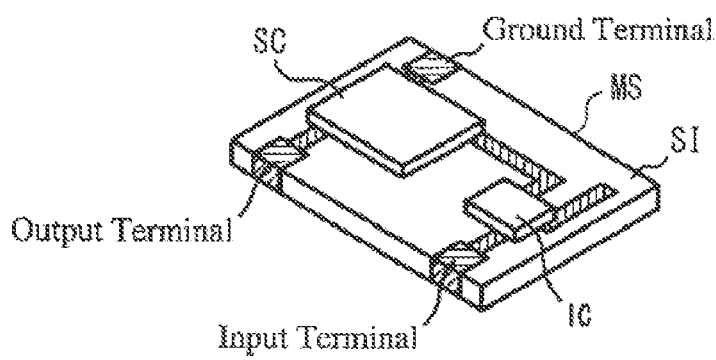
Fig. 32
CONVENTIONAL
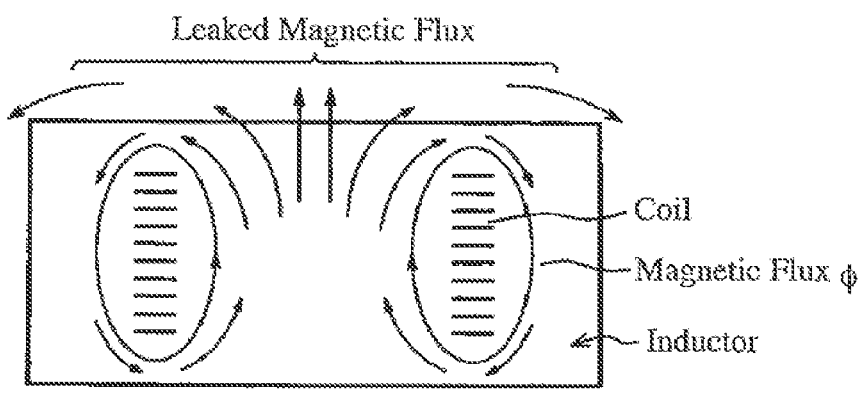

DC-DC CONVERTER

CROSS REFERENCE TO RELATED APPLICATIONS

This is a Continuation of application Ser. No. 12/091,601 filed Apr. 25, 2008, which is a 371 of Application No. PCT/JP2006/321682 filed Oct. 30, 2006, claiming the priority of JP 2005-314649 filed Oct. 28, 2005, which are hereby incorporated by reference.

FIELD OF THE INVENTION

The present invention relates to a small DC-DC converter having excellent heat dissipation, with reduced magnetic flux leakage and parasitic inductance.

BACKGROUND OF THE INVENTION

Many of various mobile electronics equipments such as cell phones, mobile information terminals PDA, note PCs, mobile audio/video players, digital cameras, video cameras, etc. have DC-DC converters as devices for converting power source voltage to operation voltage. As one example of the DC-DC converter circuits, FIG. 26 shows a step-down DC-DC converter circuit comprising an input capacitor Cin, an output capacitor Cout, an output inductor Lout, and a semiconductor integrated circuit IC comprising a control circuit CC, etc. In the step-down DC-DC converter, switching devices (for instance, field effect transistors) in the semiconductor integrated circuit IC are switched according to a control signal, to lower a DC input voltage Vin to an output voltage Vout[=Ton/(Ton+Toff)×Vin], wherein Ton is a time period in which the switching devices are turned on, and Toff is a time period in which the switching devices are turned off. The control of a Ton/Toff ratio makes it possible to stably provide a constant output voltage Vout even from the varying input voltage Vin.

FIG. 27 shows one example of switching circuits in the semiconductor integrated circuit IC. A control circuit CC for controlling the switching operation of alternately turning on and off MOS transistors SW1, SW2 is formed on a silicon semiconductor substrate. Because the control circuit CC per se is known, its explanation will be omitted. The input capacitor Cin stabilizes the input voltage Vin in a transient state while preventing spike voltage, though it may be omitted. A filter circuit (smoothing circuit) for outputting the DC voltage Vout is a combination of an output inductor Lout for storing and discharging current energy, and an output capacitor Cout for storing and discharging voltage energy.

To reduce the size of DC-DC converters, increasing higher switching frequencies have been getting used, and DC-DC converters switched at a frequency of 1 MHz are now used. Also, higher speed and function as well as lower operation voltage and higher current have been getting used for semiconductor devices such as CPUs, requiring that DC-DC converters provide lower-voltage, higher-current output. However, lower operation voltage makes the semiconductor devices susceptible to the output voltage fluctuation (ripple) of the DC-DC converters. Proposed to prevent this are DC-DC converters having switching frequencies further increased to about 2-10 MHz.

FIG. 28 shows one example of step-up DC-DC converter circuits. This DC-DC converter comprises an input inductor Lin, an output capacitor Cout, and a semiconductor integrated circuit IC comprising a control circuit CC. By controlling time periods of turning on and off switching devices, a high output voltage Vout is obtained from an input voltage Vin.

As another example of DC-DC converters, FIG. 29 shows a multi-phase, step-down DC-DC converter comprising an input capacitor Cin, an output capacitor Cout, output inductors Lout1, Lout2, and a semiconductor integrated circuit IC comprising a control circuit CC. The multi-phase DC-DC converter comprises pluralities of switching circuits, which are operated with different phases lest that their switching periods overlap, current outputs from the switching circuits being combined by a smoothing circuit. This flows low current in each path and suppresses the ripple.

Because such a circuit has as large an apparent operation frequency as n times the switching frequency, the switching frequency can be made 1/n. Accordingly, output inductors Lout1, Lout2 having excellent high-frequency characteristics need not be used, but high-Q-value inductors may be used, expanding the freedom of selecting devices. Multi-phase DC-DC converters are operated with a phase difference of 180° in the case of a two-phase type, and with a phase difference of 120° in the case of a three-phase type. Increase in the number m of phases increases the number of inductors, while reducing inductance necessary for each inductor to 1/m. As a result, small inductors and high-Q-value inductors can be used, thereby avoiding the DC-DC converters from becoming extremely large.

Such a DC-DC converter is generally constituted by a semiconductor integrated circuit IC (active element) comprising switching devices and a control circuit CC, and passive elements such as an inductor and a capacitor, etc., which are mounted on a circuit board such as a printed circuit board having connecting lines, etc. as a discrete circuit. Among the passive elements, an inductor that should have inductance of at least several μH is large, occupying a large area of the circuit board, and it is not easy to reduce its size. Further, because the circuit board should have a line pattern connecting the active element and the passive elements, there is a limit to miniaturize the DC-DC converter constituted as a discrete circuit.

For size reduction, the integration of a semiconductor integrated circuit and inductors was proposed. For instance, JP 2004-063676 A discloses a DC-DC converter comprising a printed circuit board PB having connecting terminals (stud terminals) ST, a chip inductor CI connected to the terminals ST, and a semiconductor integrated circuit IC mounted on the printed circuit board PB, the chip inductor CI and the semiconductor integrated circuit IC being vertically overlapping (see FIG. 30). JP 2005-124271 A discloses a DC-DC converter comprising a semiconductor integrated circuit IC and a smoothing capacitor SC disposed on an upper surface of a glass-epoxy, multi-layer substrate MS containing a smoothing inductor SI, the smoothing inductor SI, the smoothing capacitor SC and the semiconductor integrated circuit IC being connected by wiring on the multi-layer substrate MS (see FIG. 31).

Having no wiring patterns for connecting the active elements and passive elements, the DC-DC converters of JP 2004-063676 A and JP 2005-124271 A need only small mounting areas, but they suffer the following problems.

The first problem is that a chip inductor CI that should have inductance of several μH cannot be miniaturized like a semiconductor integrated circuit IC. Because the DC-DC converter of JP 2004-063676 A should have a slightly larger printed circuit board PB than a large chip inductor CI, it cannot be made small, but is thick due to the printed circuit board PB and the stud terminals ST. In the DC-DC converter of JP 2005-124271 A, the inductor SI generating a magnetic flux in a transverse direction of the glass-epoxy, multi-layer substrate MS should have a large number of laminated coil turns to have a desired inductance because of a small magnetic path cross section, resulting in difficulty in its miniaturization. Also, increase in the number of laminated coil turns results in larger DC resistance, which decreases an output voltage Vout. Thus, the DC-DC converter has low conversion efficiency.

The second problem is a magnetic flux leaking from an inductor. Because the semiconductor integrated circuit is disposed close to the inductor in the DC-DC converters of JP 2004-063676 A and JP 2005-124271 A, a magnetic flux leaking from the inductor should be reduced sufficiently. FIG. 32 shows a magnetic flux generated from a laminated inductor comprising electric insulating layers (dummy insulating layers) and coil patterns alternately laminated, ends of the coil patterns being successively connected to form the laminated coil, and the outermost end being connected to an external electrode. The magnetic flux generated from the laminated coil passes through the dummy insulating layers, and partially leaks when the dummy insulating layers are non-magnetic or not sufficiently thick. The leaked magnetic flux acts as noise to nearby electronic parts such as a semiconductor integrated circuit, etc. When the multi-layer substrate has line patterns connecting an active element to passive elements as in JP 2005-124271 A, the leaked magnetic flux induces current in the connecting patterns, thereby generating noise.

To prevent the magnetic flux leakage, the dummy insulating layer is made thicker. Also, to prevent a magnetic flux from leaking to side surfaces, the laminated coil should be provided with a smaller diameter, the dummy insulating layer should be thicker, or the laminated coil should have a larger surrounding region. However, when the laminated coil has a smaller diameter, the number of layers for coil patterns should be larger accordingly, resulting in a thicker laminated inductor, a larger number of steps, and larger DC resistance. A thicker dummy insulating layer leads to a thicker laminated inductor. Also, a larger region around the laminated coil makes a multi-layer substrate larger.

The third problem is the parasitic inductance. Connecting lines of circuit elements per se have parasitic inductance. In the step-down DC-DC converter shown in FIG. 27, for instance, parasitic inductance series-connected to a source of a transistor switch SW1 generates a counter electromotive force in a connecting line having parasitic inductance when the transistor switch SW1 is OFF, increasing voltage at a source terminal of the transistor switch SW1. This results in a large turn-on loss, which leads to lower conversion efficiency. When a line pattern is formed on a printed circuit board as in JP 2004-063676 A and JP 2005-124271 A, as large inductance as to lower conversion efficiency is not generated. But when line pattern is formed on the multi-layer substrate 10 using a magnetic material, large parasitic inductance is likely generated.

The fourth problem is heat generated by a semiconductor integrated circuit. Insufficient heat dissipation is likely to cause thermal runaway in the transistor switch. Also, when a magnetic material is used for insulating layers constituting an inductor, the inductance varies, resulting in lower conversion efficiency.

OBJECT OF THE INVENTION

Accordingly, an object of the present invention is to provide a small DC-DC converter having excellent heat dissipation, with reduced magnetic flux leakage and parasitic inductance.

Disclosure of the Invention

The DC-DC converter of the present invention comprises a soft-magnetic, multi-layer substrate provided with a laminated coil constituted by connecting pluralities of conductor lines, and a semiconductor integrated circuit device comprising a switching device and a control circuit CC, which are mounted on the soft-magnetic, multi-layer substrate, the semiconductor integrated circuit device comprising an input terminal, an output terminal, a first control terminal for controlling the ON/OFF of the switching device, a second control terminal for variably controlling output voltage, and pluralities of ground terminals;

the soft-magnetic, multi-layer substrate comprising first external terminals formed on a first main surface, first connecting wires formed on the first main surface and/or on nearby layers, second connecting wires formed between the side surface of the multi-layer substrate and a periphery of the laminated coil, and second external terminals formed on a second main surface; and terminals of the semiconductor integrated circuit device being connected to the first external terminals on the multi-layer substrate, at least part of the first external terminals being electrically connected to the second external terminals through the first and second connecting wires, and the input or output terminal being connected to the second external terminals via the laminated coil.

The multi-layer substrate preferably has an overcoat glass on an outer surface, and an insulating layer therein.

The DC-DC converter may be a multi-phase type in which the semiconductor integrated circuit device has pluralities of output terminals, to which one ends of different laminated coils are connected, and the other ends of the laminated coils are connected to second common external terminals. To reduce magnetic coupling between pluralities of laminated coils, pluralities of laminated coils are preferably arranged in a horizontal direction inside the multi-layer substrate, with adjacent coils having different winding directions.

The semiconductor integrated circuit device may have a negative feedback terminal, the first external terminal connected to the negative feedback terminal being connected to the other end of the laminated coil connected to the output terminal. The negative feedback terminal may be connected to the other end of the laminated coil via a resistor. The resistor may be a chip resistor, or a resistor printed on the multi-layer substrate.

Capacitance elements constituting a filter circuit (smoothing circuit) for preventing spike voltage and outputting DC voltage are preferably mounted to the first external terminals formed on the first main surface of the multi-layer substrate, and the input and/or output terminals of the semiconductor integrated circuit device are preferably grounded. The mounting of capacitance elements to the multi-layer substrate can reduce the area of the DC-DC converter circuit occupying a circuit board. Also, the mounting of capacitance elements can reduce influence of parasitic inductance generated by the first and second connecting wires, etc.

The multi-layer substrate preferably comprises first common connecting wires to which pluralities of ground terminals of the semiconductor integrated circuit device are connected, the first common connecting wires being connected to the second external terminals via pluralities of second connecting wires. Such structure reduces parasitic inductance between the semiconductor integrated circuit device and the ground, and efficiently lets heat generated by the semiconductor integrated circuit device escape.

The second connecting wires are preferably conductor strips formed on the side surface of the multi-layer substrate. Such structure reduces parasitic inductance more than when the second connecting wires are formed in the multi-layer substrate. The multi-layer substrate may have castellation (recesses) from the first main surface to the second main surface, and second connecting wires formed by conductor strips or side via-holes on the bottom. This enables the reduction of parasitic inductance and the mounting of other devices near the side surface of the multi-layer substrate, thereby increasing the mounting density of devices on a circuit board.

The second connecting wires can be formed by via-holes passing through pluralities of layers in a thickness direction. Although the formation of via-holes in the multi-layer substrate provides large parasitic inductance, it increases the density of devices mounted on a circuit board. To reduce the parasitic inductance, at least part of via-holes may be exposed on the side surface of the multi-layer substrate.

The second connecting wires may be formed in the multi-layer substrate such that they are partially exposed on the side surface of the multi-layer substrate. In a step-down DC-DC converter, for instance, the density of mounting devices can be increased while preventing parasitic inductance from deteriorating the characteristics of the DC-DC converter, when the second connecting wires between the input terminal and the semiconductor integrated circuit device, the second connecting wires connected to the negative feedback terminal of the semiconductor integrated circuit device, etc. are exposed on the side surface to provide low inductance, while part of the second connecting wires causing no problems in characteristics even with series-connected parasitic inductance are formed in the multi-layer substrate.

The multi-layer, insulating substrate preferably has a square shape having four side surfaces, all of which have the second external terminals connected to the ground. Such structure makes it possible to prevent a magnetic flux from leaking from the side surface of the multi-layer substrate.

The first connecting wires may have width expanding toward the second connecting wires. With such structure, heat generated by the semiconductor integrated circuit device is dissipated to the circuit board through the first connecting wires and the second external terminals connected thereto.

The multi-layer substrate preferably has a magnetic gap for preventing a magnetic flux flow and improving the DC superimposing characteristics of the laminated coil, at least in a region inside the laminated coil.

The multi-layer substrate preferably comprises a region having the laminated coil, and upper and lower insulating layer regions above and below it. Conductor lines for the laminated coil are not formed in the upper and lower insulating layer regions. With a magnetic gap disposed inside the laminated coil at least in an upper or lower insulating layer region, a magnetic flux is prevented from flowing outward, thereby reducing the leakage of a magnetic flux. The magnetic gap may be a space, or filled with a non-magnetic material, a dielectric material, or a magnetic material having lower permeability than that of the magnetic material forming the multi-layer substrate.

According to another preferred embodiment of the present invention, the upper insulating layer region has a magnetic shield formed by a conductor pattern to reduce the leakage of a magnetic flux. The magnetic shield is preferably formed on the multi-layer substrate surface, or in an upper or lower insulating layer region, which is inside the laminated coil. According to a further preferred embodiment of the present invention, at least the first main surface of the multi-layer substrate has recess in a region inside the laminated coil.

The semiconductor integrated circuit device is mounted on a region inside the laminated coil. The semiconductor integrated circuit device may be in the form of a bare chip or a package. The semiconductor integrated circuit device is preferably connected to the multi-layer substrate by wire-bonding or flip chips.

At least the first main surface of the multi-layer substrate is preferably covered with an insulating layer of a overcoat glass, a dielectric material, or a low-permeability magnetic material. The first connecting wires may be formed on or between the insulating layers.

The first main surface of the multi-layer substrate is preferably covered with a resin layer or a metal case connected to the grounded first connecting wires. Such structure makes it easy to handle devices by a mounter, thereby protecting the mounted devices and reducing the influence of external noise.

BRIEF DESCRIPTION OF THE DRAWINGS

FIG. 30 is a perspective view showing a conventional DC-DC converter.

FIG. 31 is a perspective view showing another conventional DC-DC converter.

FIG. 32 is a cross-sectional view showing a magnetic flux leaking from a laminated inductor formed in a multi-layer substrate.

DESCRIPTION OF THE PREFERRED EMBODIMENTS

Figure 1:
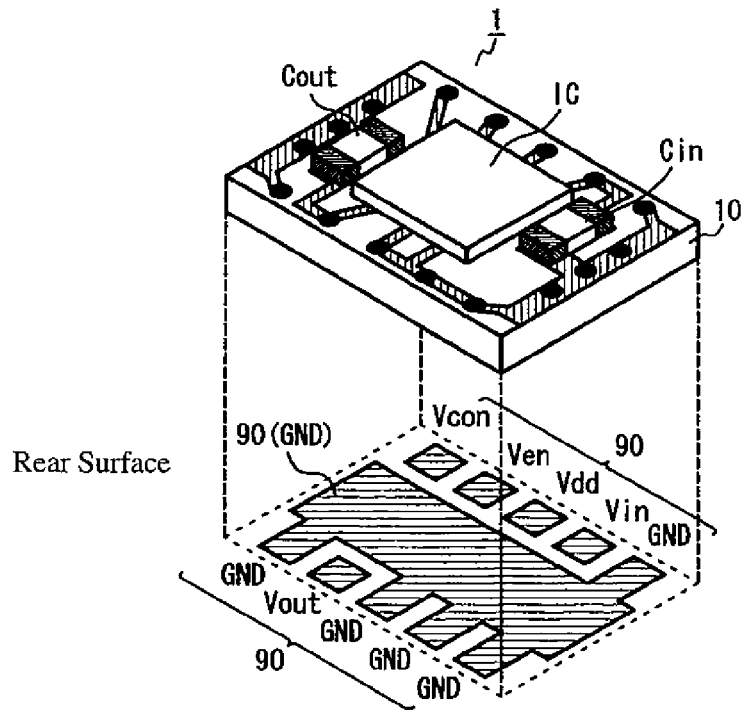
FIG. 1 is a perspective view showing a DC-DC converter according to one embodiment of the present invention.
Figure 2:
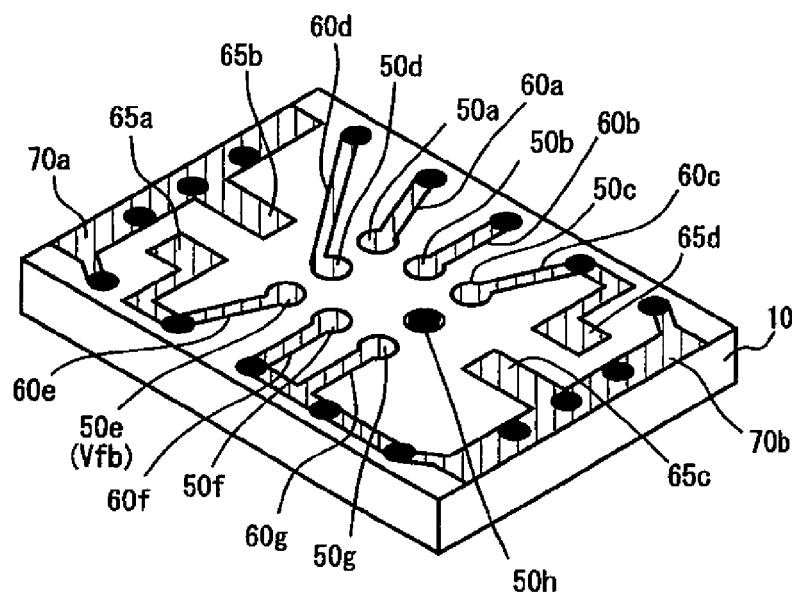
FIG. 2 is a perspective view showing a multi-layer, insulating substrate used in a DC-DC converter according to one embodiment of the present invention.
Figure 3:
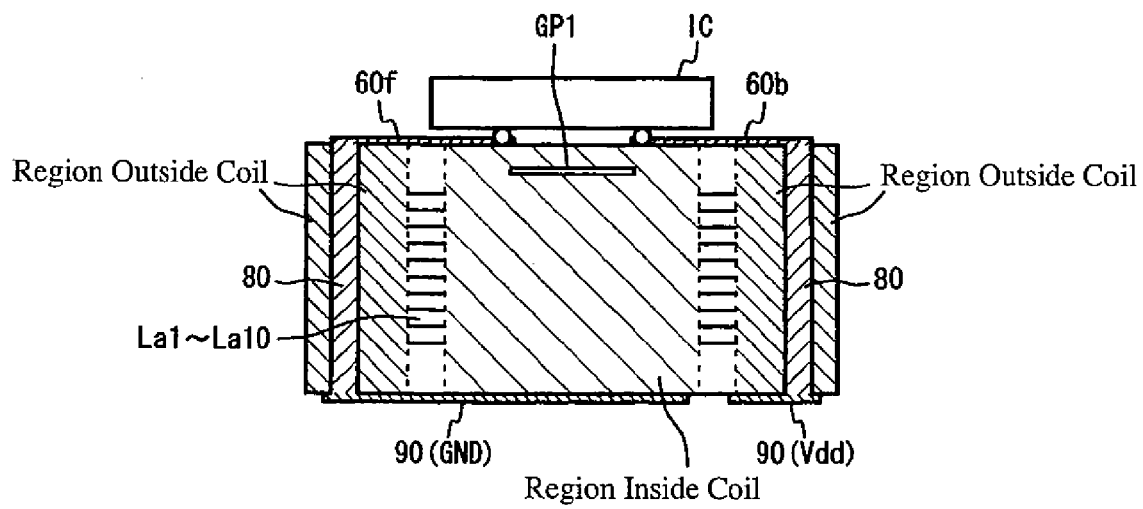
FIG. 3 is a cross-sectional view showing the internal structure of a multi-layer, insulating substrate used in a DC-DC converter according to one embodiment of the present invention.
Figure 4:
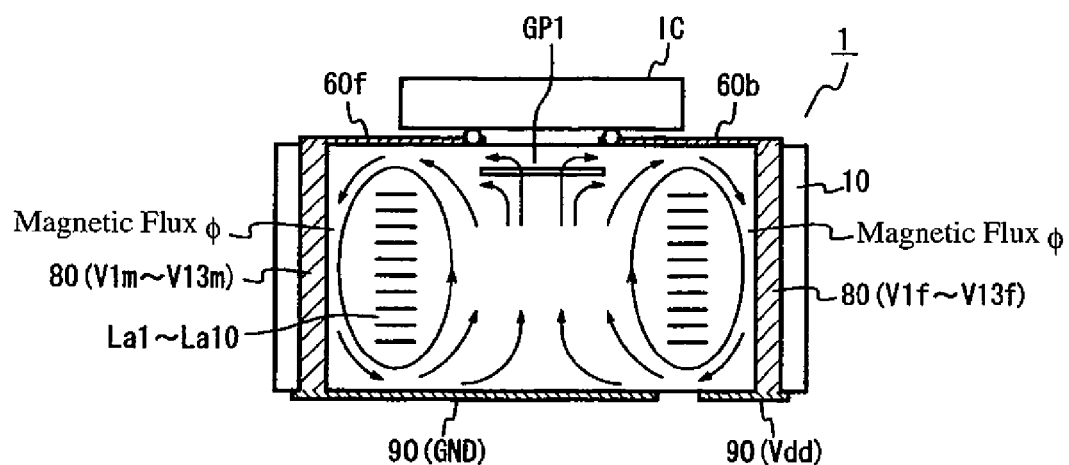
FIG. 4 is a cross-sectional view showing a magnetic flux flow generated by a laminated coil formed in a multi-layer, insulating substrate used in a DC-DC converter according to one embodiment of the present invention.
Figure 5:
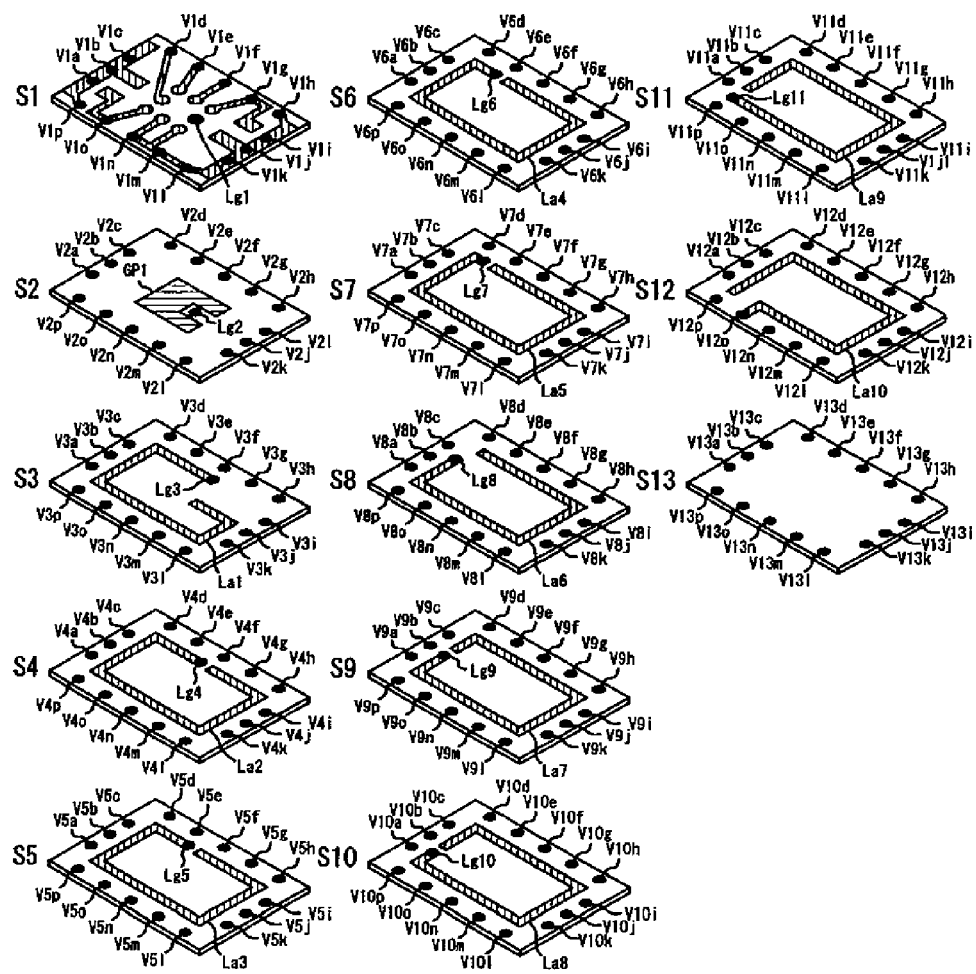
FIG. 5 is an exploded perspective view showing a multi-layer, insulating substrate used in a DC-DC converter according to one embodiment of the present invention.
Figure 26:
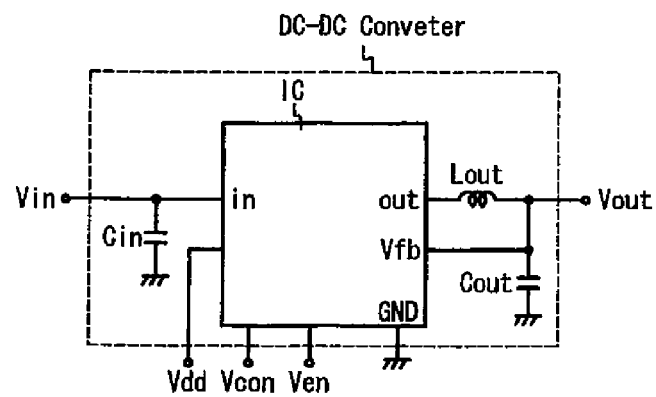
FIG. 26 is a view showing one example of the DC-DC converter circuit.
Figure 27:
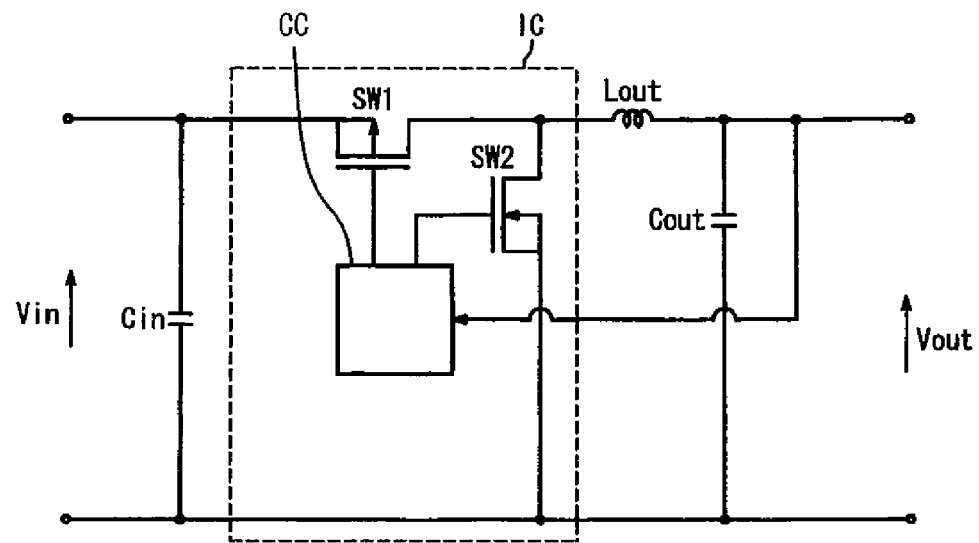
FIG. 27 is a view showing another example of the DC-DC converter circuit.
Figure 28:
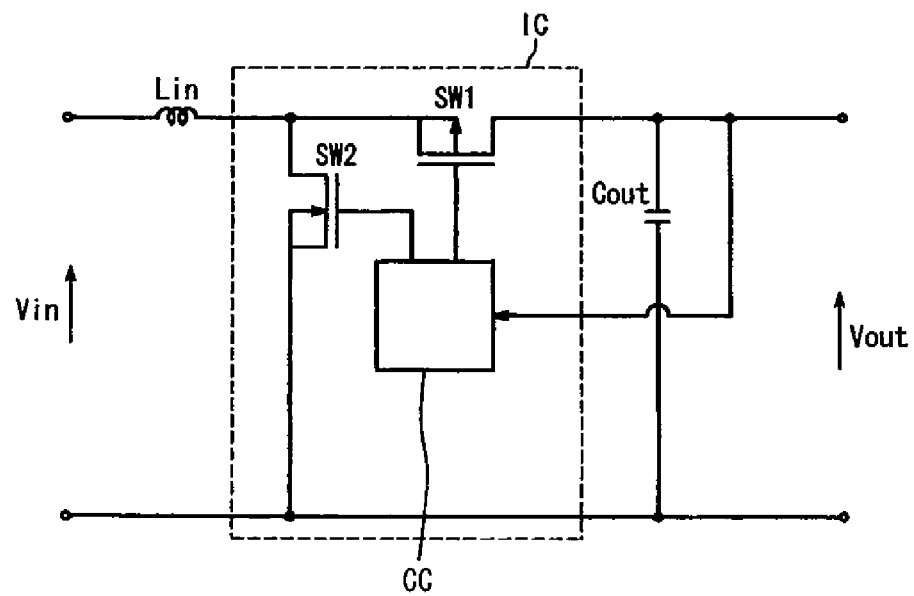
FIG. 28 is a view showing a further example of the DC-DC converter circuit.

FIG. 1 shows a DC-DC converter according to one embodiment of the present invention, FIG. 2 shows a multi-layer substrate used in the DC-DC converter, FIG. 3 shows the internal structure of the multi-layer substrate, FIG. 4 shows a magnetic flux flow generated by a laminated coil formed in the multi-layer substrate, and FIG. 5 shows the layer structure of the multi-layer substrate. This DC-DC converter has the same equivalent circuit as that of the step-down DC-DC converter shown in FIG. 26.

The multi-layer substrate 10 is formed by laminating magnetic insulating layers each having a coil pattern, and has opposing first and second main surfaces and side surfaces connecting them. The first main surface is provided with first external terminals 50a-50h for mounting a semiconductor integrated circuit device IC, first external terminals 65a-65d for mounting capacitance elements, and first connecting wires 60a-60g, 70a, 70b. The second main surface is provided with second external terminals 90 (Vcon, Ven, Vdd, Vin, Vout, GND) connected to a printed circuit board. In this embodiment, the second external terminals 90 have a land grid array (LGA)-type terminal structure.

A metal case (not shown) connected to the first connecting wires 70a, 70b may be disposed to cover the semiconductor integrated circuit device IC and the capacitance elements mounted on the first main surface. The metal case may be formed by a thin plate made of steel such as stainless steel, which is formed into a cap shape having a ceiling and opposing sidewalls, and part of the walls may have such openings not hindering mounting stability. The metal case is provided with a conductive plating of Ni, Sn, etc. The connection of the metal case walls to the first connecting wires 70a, 70b by a solder or a conductive adhesive can shield noise and protect the mounted devices.

The magnetic insulating layer is made of a sintered magnetic material such as soft ferrite, or a magnetic powder-resin composite in which magnetic powder of soft ferrite, amorphous or micro-crystalline soft-magnetic alloys, etc. is dispersed in a resin. The soft ferrite is preferably spinel ferrite of Ni—Cu, Ni—Zn, Ni—Cu—Zn, Mg—Zn or Li—Zn having resistivity of $1 \times 10^3$ $\Omega \cdot$cm or more, or hexagonal ferrite having excellent high-frequency characteristics.

The multi-layer substrate 10 made of soft ferrite is preferably formed by an LTCC (low-temperature co-fired ceramics) method and a printing method. For instance, a soft ferrite paste is formed into green sheets by a doctor blade method, a calendar roll method, etc., and a conductive paste of Ag, Cu or their alloys is printed or coated in a predetermined pattern on each green sheet. These green sheets are laminated, and sintered at a desired temperature of 1100° C. or lower depending on the conductive paste and the ferrite.

The multi-layer substrate 10 made of a magnetic powder-resin composite is obtained by forming via-holes in each sheet of the magnetic powder-resin composite, and forming a thin metal layer of Cu, etc. on the sheet by a plating method, etc. The multi-layer substrate 10 is then coated with a photoresist, subjected to patterning exposure to light to remove a photoresist layer from other regions than the wiring and the via-holes, and then chemically etched to remove the thin metal layer. Thus, a magnetic powder-resin composite sheet having the desired coil pattern having via-holes can be obtained. Pluralities of the magnetic powder-resin composite sheets each having a coil pattern are laminated, and pressure-bonded while heating to provide a multi-layer substrate 10.

The coil patterns are connected through means such as via-holes (shown by black circles in the figure), etc. to form a laminated coil (inductor). Among pluralities of insulating layers S1-S13 in the multi-layer substrate 10, the insulating layers S3-S12 have coil patterns. The insulating layers S3-S12 are laminated with upper and lower insulating layers S1, S2, S13, with the ends of the coil patterns successively connected through via-holes Lg3-Lg11. The insulating layers S3-S12 constitute a region having the laminated coil, the insulating layers S1, S2 constitute the upper insulating layer region, and the insulating layers S12, S13 constitute the lower insulating layer region.

One end of the laminated coil reaches the first main surface through via-holes Lg1, Lg2 and is connected to the first external terminal 50h. The other end of the laminated coil reaches the second main surface through via-holes V12o, V13o, and is connected to the second external terminal Vout, and further connected to an IC-mounting, first external terminal 50e (connected to a negative feedback terminal of the semiconductor integrated circuit device) and a capacitor-mounting, first external terminal 65a through via-holes V1o-V11o and the first connecting wire 60e.

The second external terminals 90 are named after the connecting terminals Vcon, Ven, Vdd, Vin, Vout and GND of the semiconductor integrated circuit device IC. The second external terminal 90 (Vcon) is connected to an output-voltage-variably-controlling terminal (second control terminal) Vcon of the semiconductor integrated circuit device IC. The second external terminal 90 (Ven) is connected to an output ON/OFF-controlling terminal Ven of the semiconductor integrated circuit device IC. The second external terminal 90 (Vdd) is connected to a terminal (first control terminal) Vdd for ON/OFF-controlling the switching devices in the semiconductor integrated circuit device IC. The second external terminal 90 (Vin) is connected to an input terminal Vin of the semiconductor integrated circuit device IC. The second external terminal Vout is connected to an output terminal Vout of the semiconductor integrated circuit device IC. The second external terminal 90 (GND) is connected to a ground terminal GND of the semiconductor integrated circuit device IC.

Each layer is provided with pluralities of via-holes V1a-V13p in a region outside the coil pattern. The via-holes on the insulating layers are connected in the thickness direction of the multi-layer substrate (along a magnetic field generated by the laminated coil), thereby forming the second connecting wires 80 for connecting the first connecting terminals 50a-50h to the second connecting terminals 90.

In this embodiment, pluralities of second connecting wires 80 extend around all four sides of the laminated coil, and are connected to the second external terminal 90 (GND), exhibiting a magnetic shield effect that prevents a magnetic flux from leaking from the side surfaces of the multi-layer substrate 10.

The upper surface of the multi-layer substrate 10 is provided with the semiconductor integrated circuit device IC in a substantially center portion, and input and output capacitors Cin, Cout therearound. Although the arrangement of the first external terminals 50a-50h is determined by the positions of the terminals of the semiconductor integrated circuit device IC, they are preferably positioned inside the laminated coil pattern when the multi-layer substrate 10 is viewed from the first main surface side. The first connecting wires 60a-60g radially extend from the first external terminals 50a-50g to the side surface such that they are as short as possible, and connected to via-holes V1d-V1g, V1m-V1o. Even when a magnetic flux leaks from the laminated coil to the first main surface, such structure reduces the magnetic flux crossing the first connecting wires, thereby lowering noise.

The second main surface of the multi-layer substrate 10 is provided with the second external terminal 90 (GND) in a wide region including the center portion. A magnetic shield effect provided by the second external terminal 90 (GND) and other second external terminals 90 reduces a magnetic flux leaking to the second main surface. The second external terminal 90 (GND) is connected to a circuit board by soldering, thereby permitting heat generated by the semiconductor integrated circuit device IC to escape to the circuit board effectively.

In this embodiment, the multi-layer substrate 10 has a magnetic gap GP1 in the upper insulating layer region. The magnetic gap GP1 is a space, which is vacant or filled with a non-magnetic material, a dielectric material or a low-permeability magnetic material. The space may be provided by a sheet-punching method, a method of forming a portion corresponding to the space with a combustible carbon paste or a resin and burning it, etc. Alternatively, the magnetic gap may be formed from a paste of a non-magnetic material, a dielectric material or a low-permeability magnetic material, which is printed or formed into a sheet. Materials for forming the magnetic gap GP1 include various types of glass such as $B_2O_3$—$SiO_2$ glass and $Al_2O_3$—$SiO_2$ glass, Zn ferrite, $ZrO_2$, $Li_2O$—$Al_2O_3$-$4SiO_2$, $Li_2O$—$Al_2O_3$-$2SiO_2$, $ZrSiO_4$, $CaZrO_3$, $SiO_2$, $TiO_2$, $WO_3$, $Ta_2O_5$, $Nb_2O_5$, etc.

The magnetic gap GP1 provides large magnetic resistance, so that a magnetic flux $\phi$ flows predominantly from a region inside the laminated coil to a region outside the laminated coil, resulting in a reduced amount of a magnetic flux $\phi$ leaking to the first main surface. The magnetic flux passing through the magnetic gap GP1 flows through the region outside the laminated coil, resulting in a remarkably reduced amount of a leaked magnetic flux than when there is no magnetic gap GP1.

Figure 6:
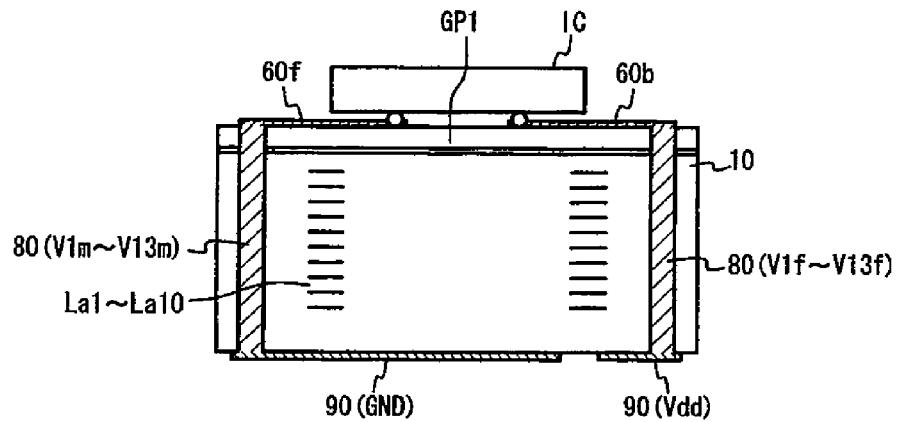
FIG. 6 is a cross-sectional view showing the internal structure of a multi-layer, insulating substrate used in a DC-DC converter according to another embodiment of the present invention.

The width of the magnetic gap GP1 is 5 μm or more, preferably 20 μm or more. The magnetic gap GP1 is preferably formed in a region including a centerline of the laminated coil, whose area is ½ or more of that of the region inside the laminated coil. As shown in FIG. 6, a magnetic gap GP1 may be provided substantially in the entire area of the multi-layer substrate 10.

Figure 7:
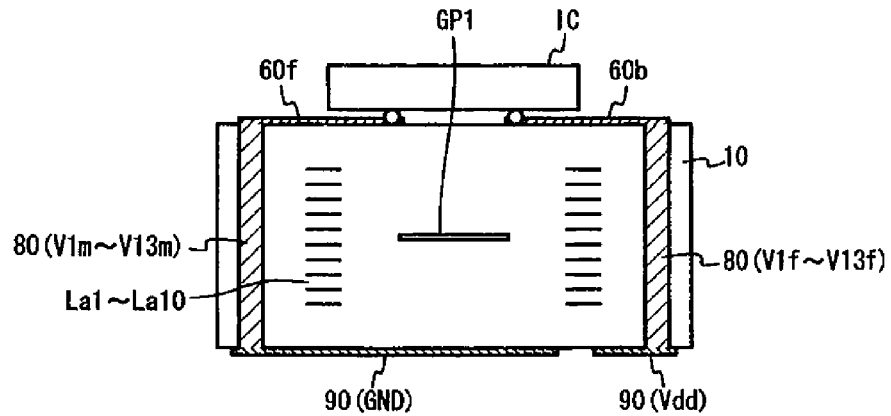
FIG. 7 is a cross-sectional view showing the internal structure of a multi-layer, insulating substrate used in a DC-DC converter according to a further embodiment of the present invention.
Figure 8:
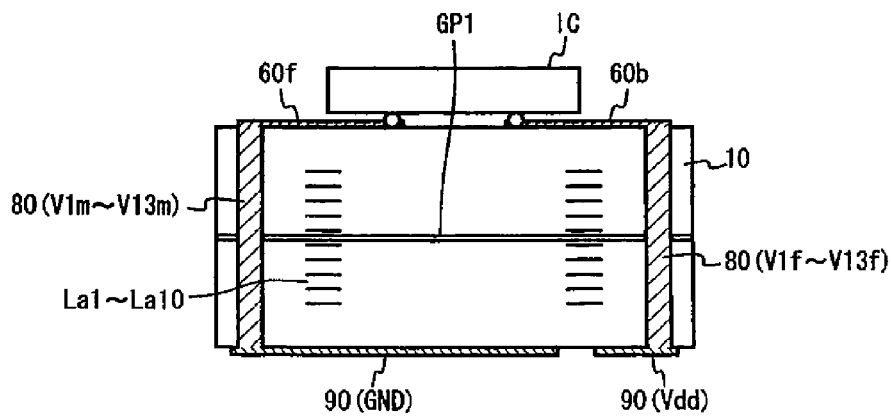
FIG. 8 is a cross-sectional view showing the internal structure of a multi-layer, insulating substrate used in a DC-DC converter according to a still further embodiment of the present invention.

As shown in FIGS. 7 and 8, the magnetic gap GP1 may be provided in a region having the laminated coil. FIG. 7 shows a magnetic gap GP1 provided in a region inside the laminated coil, and FIG. 8 shows a magnetic gap GP1 provided in an entire horizontal area (including a region inside the laminated coil) in the multi-layer substrate 10. In these cases, the laminated coil has stable DC superimposing characteristics.

Figure 9:
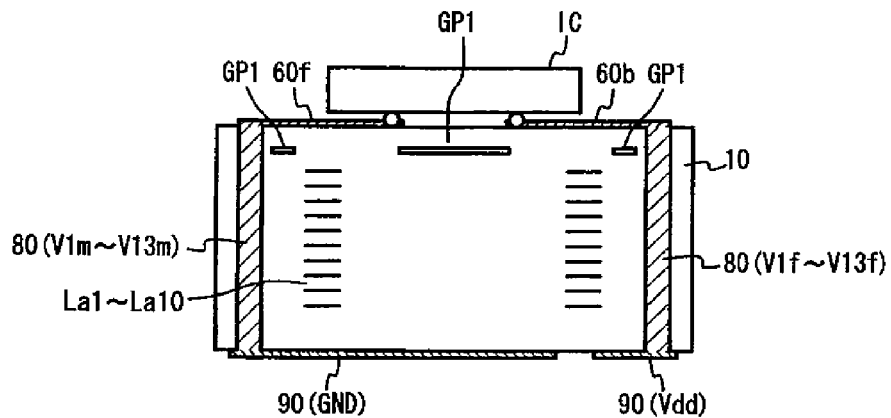
FIG. 9 is a cross-sectional view showing the internal structure of a multi-layer, insulating substrate used in a DC-DC converter according to a still further embodiment of the present invention.
Figure 10:
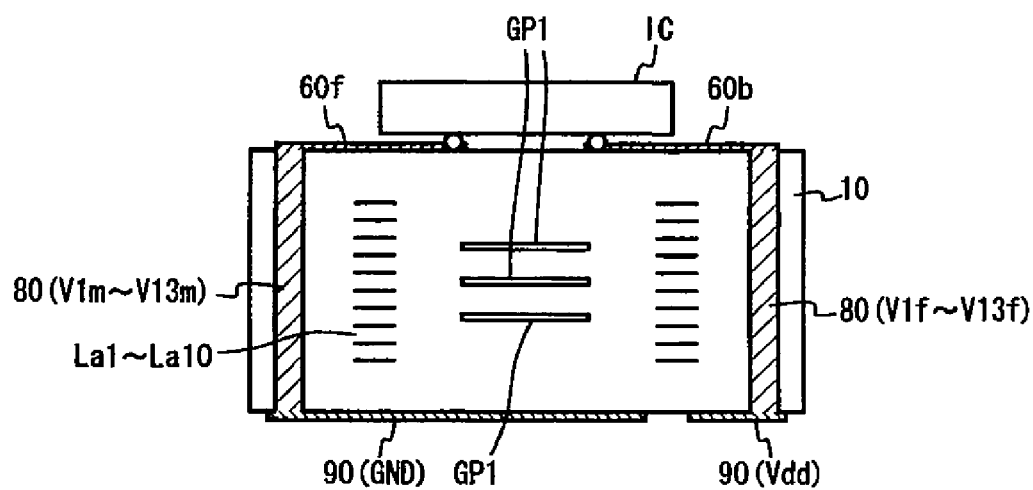
FIG. 10 is a cross-sectional view showing the internal structure of a multi-layer, insulating substrate used in a DC-DC converter according to a still further embodiment of the present invention.
Figure 11:
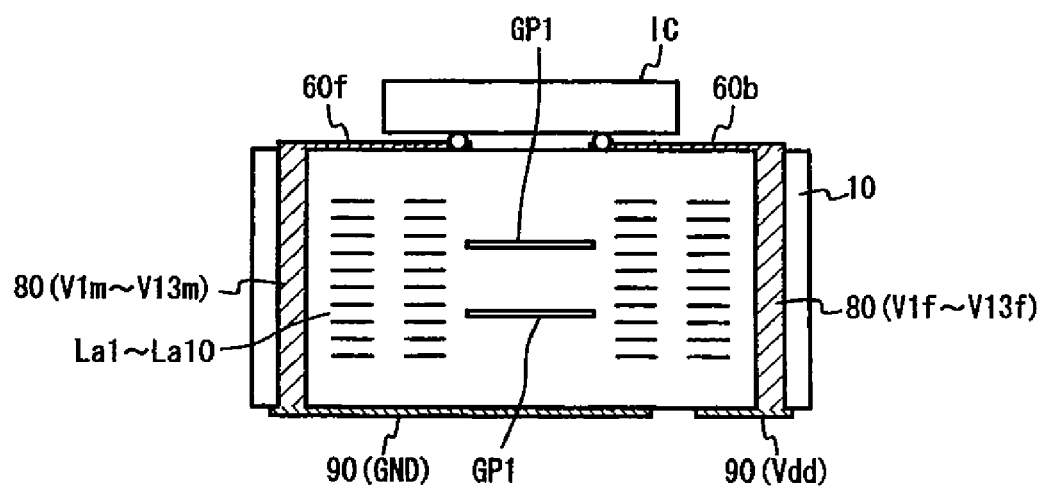
FIG. 11 is a cross-sectional view showing the internal structure of a multi-layer, insulating substrate used in a DC-DC converter according to a still further embodiment of the present invention.

As shown in FIGS. 9 and 10, the magnetic gap GP1 may be constituted by pluralities of magnetic gaps arranged in one or more planes. FIG. 9 shows magnetic gaps arranged in regions inside and outside the laminated coil, and FIG. 10 shows pluralities of magnetic gaps GP1 arranged in a region inside the laminated coil at different positions in a lamination direction. When pluralities of laminated coils are formed in the multi-layer substrate as shown in FIG. 11, a magnetic gap GP1 or a magnetic shield SG1 may be disposed inside the laminated coils.

Figure 12:
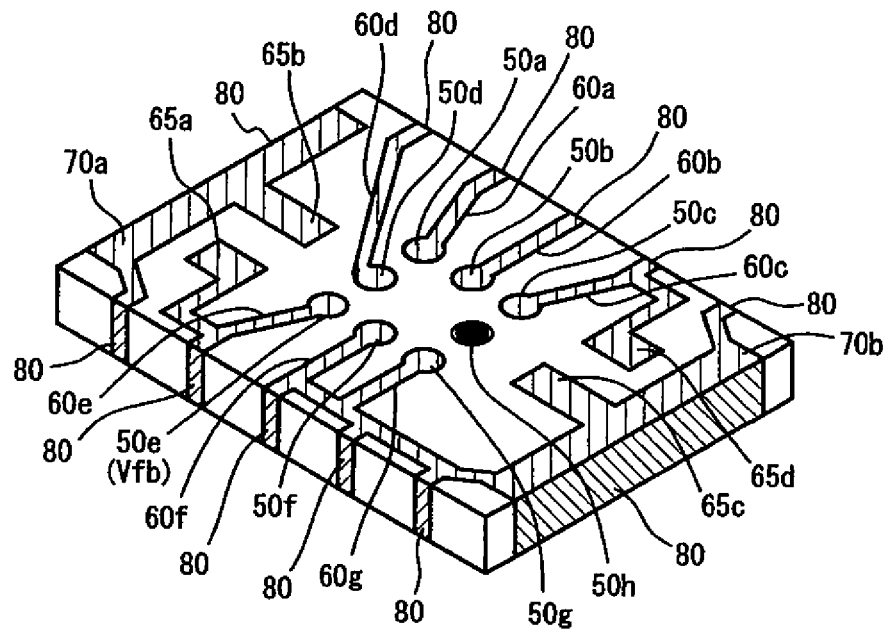
FIG. 12 is a perspective view showing a multi-layer, insulating substrate used in a DC-DC converter according to a still further embodiment of the present invention.

FIG. 12 shows a multi-layer substrate used in a DC-DC converter according to a still further embodiment of the present invention. Second connecting wires 80 connected to second external terminals 90 are electrode strips formed on four side surfaces of the multi-layer substrate. The second connecting wires 80 may be formed by exposed via-holes, or the printing, transferring, etc. of a conductive paste. Because the other structure is the same as in the above embodiment, its explanation will be omitted. The formation of the second connecting wires 80 on the multi-layer substrate surfaces reduces parasitic inductance. This DC-DC converter module also has excellent voltage conversion efficiency despite its small size.

Figure 13:
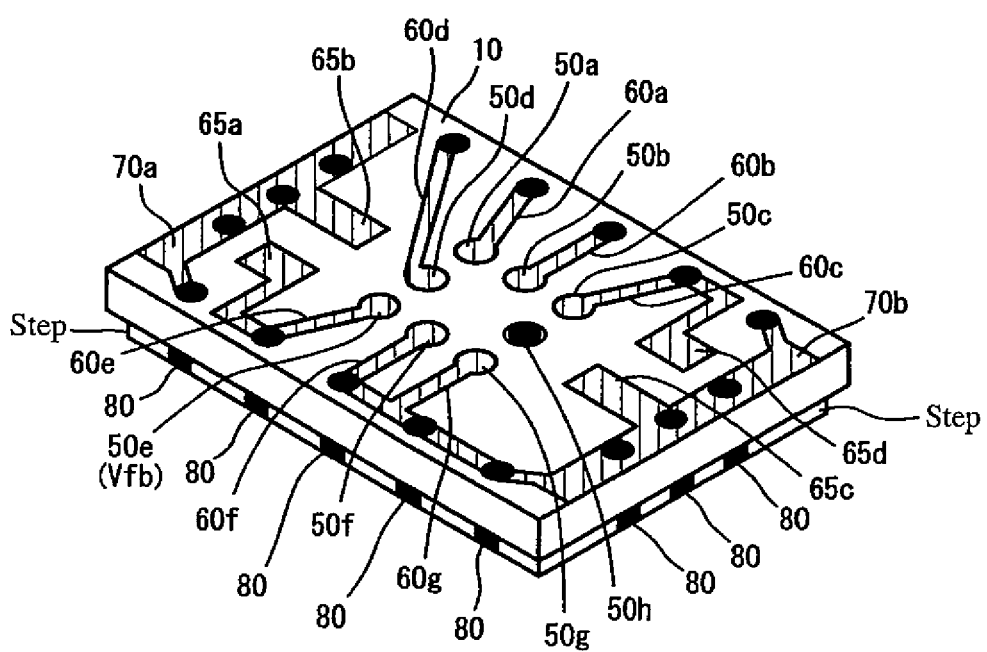
FIG. 13 is a perspective view showing a multi-layer, insulating substrate used in a DC-DC converter according to a still further embodiment of the present invention.

FIG. 13 shows a multi-layer substrate used in a DC-DC converter module according to a still further embodiment of the present invention. Second connecting wires 80 connected to second external terminals 90 may be formed by via-holes, which are exposed on four side surfaces of the multi-layer substrate from steps to a second main surface. Because via-holes exposed on the side surfaces can be soldered, they can be strongly connected to a printed circuit board with reduced parasitic inductance. Although each side surface has a step in this embodiment, the step may be formed only on a side surface having lines whose series-connected parasitic inductance would be harmful to characteristics.

Figure 14:
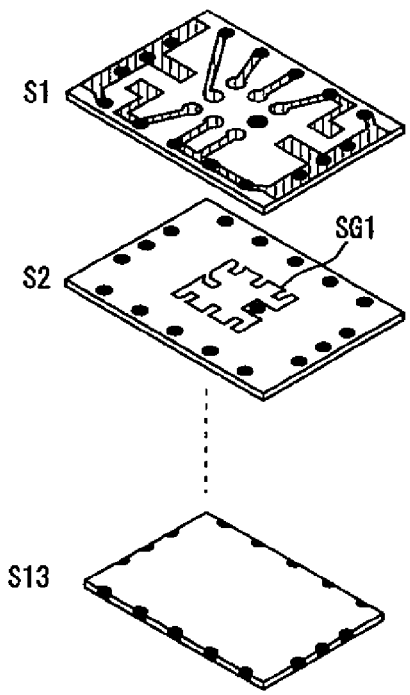
FIG. 14 is a partially exploded perspective view showing a multi-layer, insulating substrate used in a DC-DC converter according to a still further embodiment of the present invention.
Figure 15:
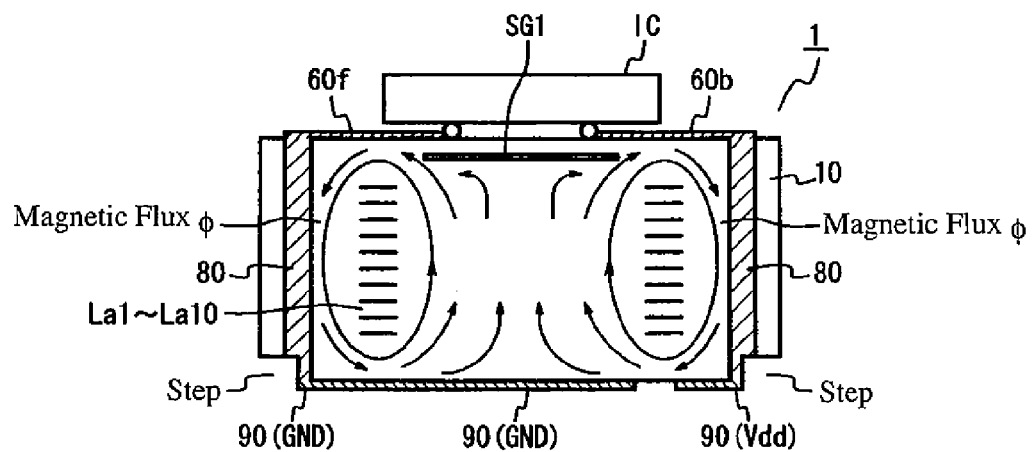
FIG. 15 is a cross-sectional view showing a magnetic flux flow generated by a laminated coil formed in a multi-layer, insulating substrate used in a DC-DC converter according to a still further embodiment of the present invention.

Another feature of this embodiment is that the multi-layer substrate 10 has a magnetic shield SG1 formed by a conductor pattern in an upper insulating layer region. FIG. 14 shows part of layers in the multi-layer substrate, and FIG. 15 shows a magnetic flux flow. The magnetic shield SG1 is formed by printing a conductive paste like each coil pattern. As shown in FIG. 15, a magnetic flux does not flow outward from the magnetic shield SG1, suppressing the leakage of a magnetic flux. Although the magnetic shield is formed only in a region inside the laminated coil in this embodiment, it may cover a wide region except for the via-holes. The DC-DC converter comprising such a multi-layer substrate also has excellent voltage conversion efficiency despite its small size.

Figure 16:
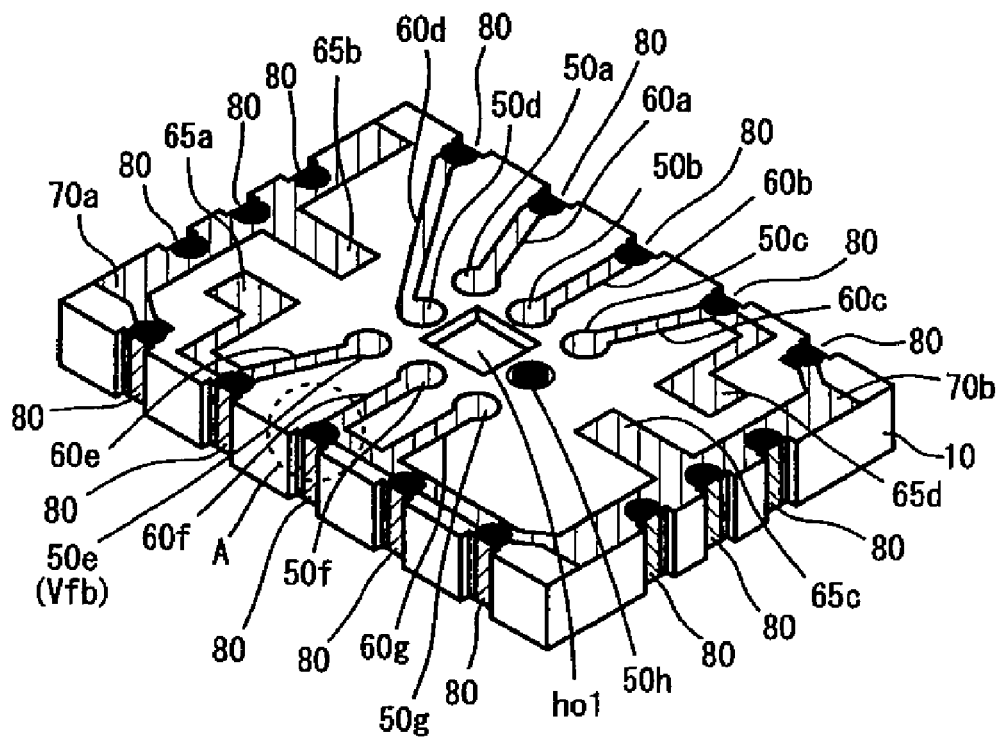
FIG. 16 is a perspective view showing a multi-layer, insulating substrate used in a DC-DC converter according to a still further embodiment of the present invention.
Figure 17:
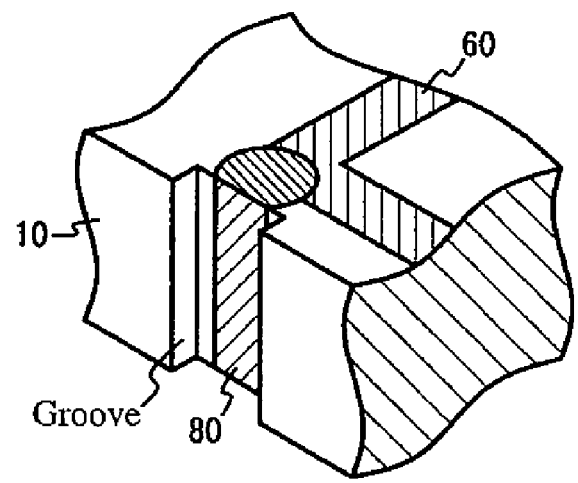
FIG. 17 is an enlarged perspective view showing part of the multi-layer, insulating substrate of FIG. 16.

FIG. 16 shows a multi-layer substrate used in a DC-DC converter according to a still further embodiment of the present invention. Although second connecting wires 80 connected to second connecting terminals 90 are formed by via-holes, the multi-layer substrate is provided with castellation on four side surfaces between first and second main surfaces, so that the via-holes are exposed in the recesses of the castellation. FIG. 17 is an enlarged view showing a portion A in the multi-layer substrate of FIG. 16. Because ribbon-shaped via-holes are exposed in the bottoms of the recesses or grooves on the side surfaces of the multi-layer substrate, soldering can be conducted in a wider area than in the multi-layer substrate of FIG. 13, resulting in stronger connection to a circuit board. Also, the parasitic inductance can be reduced substantially to the same level as in FIG. 12.

Figure 18:
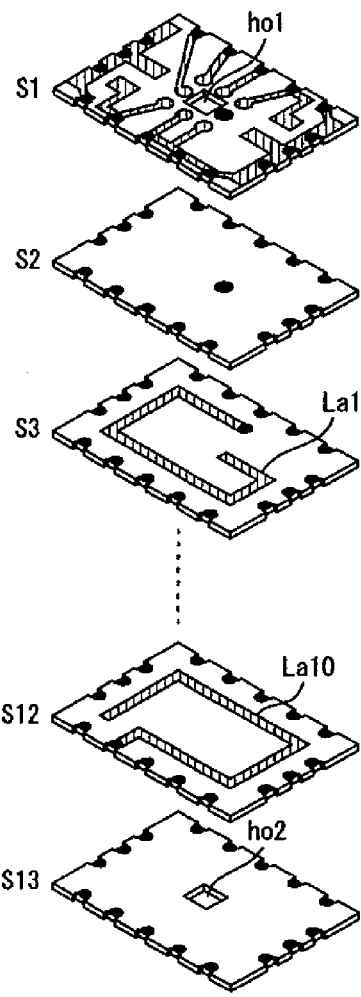
FIG. 18 is a partially exploded perspective view showing a multi-layer, insulating substrate used in a DC-DC converter according to a still further embodiment of the present invention.
Figure 19:
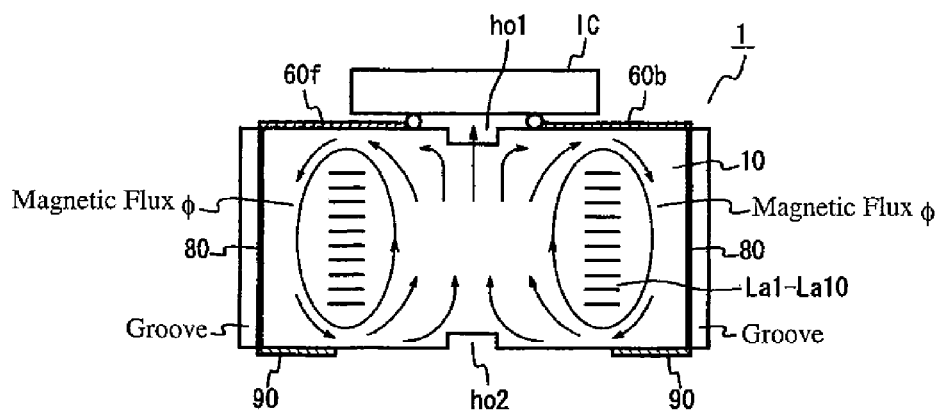
FIG. 19 is a cross-sectional view showing a magnetic flux flow generated by a laminated coil formed in a multi-layer, insulating substrate used in a DC-DC converter according to a still further embodiment of the present invention.

Another feature of this embodiment is that the multi-layer substrate has recesses on the first and second main surfaces each in a region inside the laminated coil. FIG. 18 shows part of layers constituting the multi-layer substrate, and FIG. 19 shows a magnetic flux flow. Recesses ho1, ho2 are provided by through-holes of insulating layers in the multi-layer substrate. Although a magnetic flux ϕ flows from a region inside the laminated coil to a region outside the laminated coil through upper and lower insulating layer regions, the recesses ho1, ho2 act as magnetic gaps as shown in FIG. 19, thereby suppressing the magnetic flux from exiting from the insulating layer. Although a recess is formed on each of the first and second main surfaces in the depicted example, it may be formed at least on a main surface on which a semiconductor integrated circuit device is mounted. The DC-DC converter comprising such a multi-layer substrate also has excellent voltage conversion efficiency despite its small size.

Figure 20:
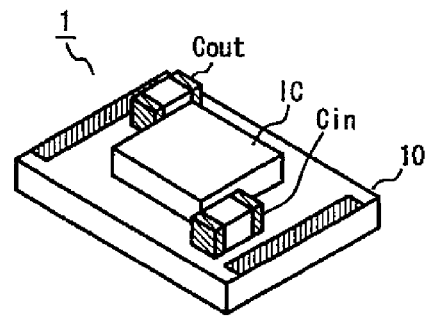
FIG. 20 is a perspective view showing a DC-DC converter according to a still further embodiment of the present invention.
Figure 21:
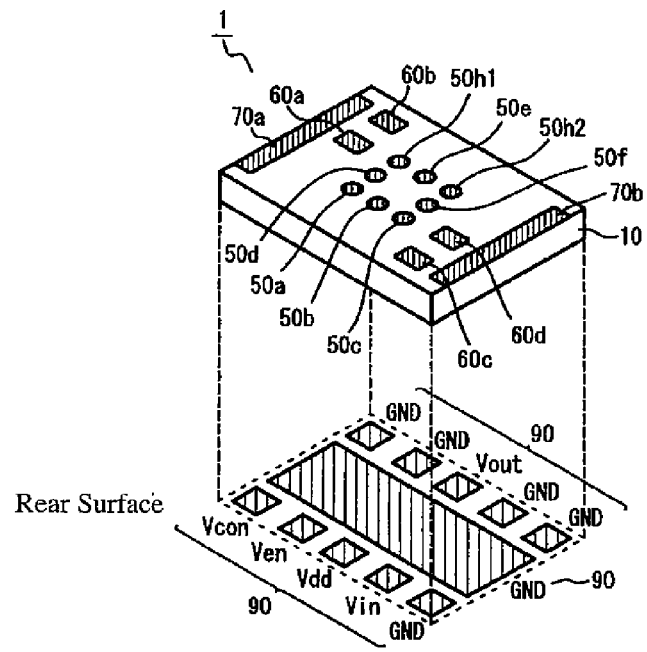
FIG. 21 is a perspective view showing a multi-layer, insulating substrate used in a DC-DC converter according to a still further embodiment of the present invention.
Figure 29:
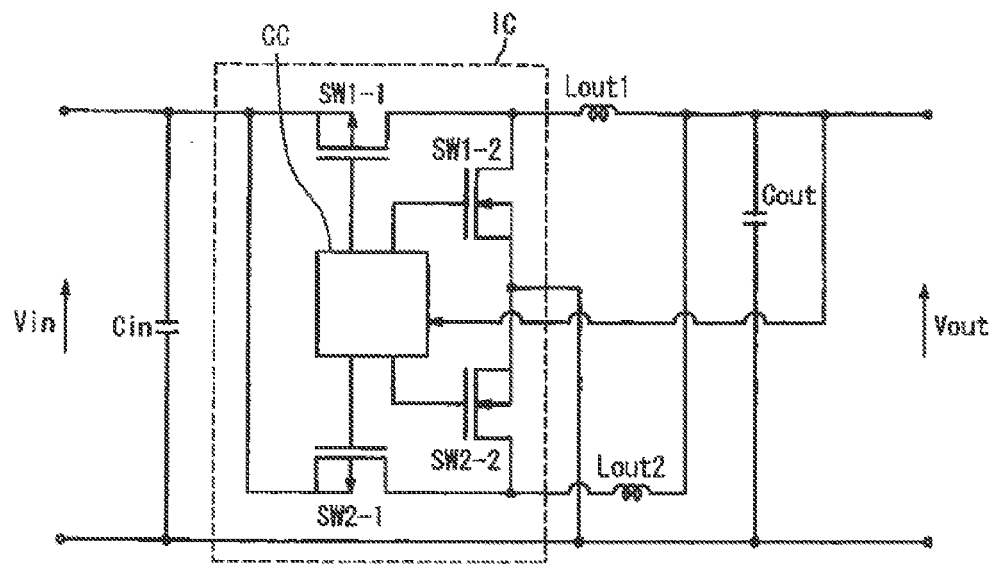
FIG. 29 is a view showing a still further example of the DC-DC converter circuit.

FIG. 20 shows a DC-DC converter according to a still further embodiment of the present invention, and FIG. 21 shows a multi-layer substrate used in the DC-DC converter. The DC-DC converter in this embodiment is a multi-phase type having two laminated coils in the multi-layer substrate. This multi-phase DC-DC converter has the same circuit structure as shown in FIG. 29. Two laminated coils (not shown) are arranged side by side in the multi-layer substrate. A semiconductor integrated circuit device IC mounted on a laminate substrate comprises a control circuit CC operating switching circuits in parallel. Like above, second external terminals 90 formed on the multi-layer substrate bear the names of terminals Vcon, Ven, Vdd, Vin, Vout and GND of the semiconductor integrated circuit device IC, to which the second external terminals 90 are connected. Because the DC-DC converter in this embodiment is substantially the same as in the above embodiments except that the second external terminal Vout is connected to the first external terminals 50h1, 50h2 via two laminated coils (not shown), its explanation will be omitted. The DC-DC converter having such a multi-layer substrate also has excellent conversion efficiency despite its small size.

Figure 22:
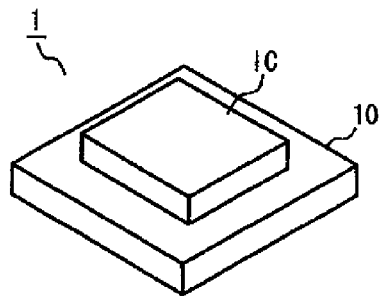
FIG. 22 is a perspective view showing a DC-DC converter according to a still further embodiment of the present invention.
Figure 23:
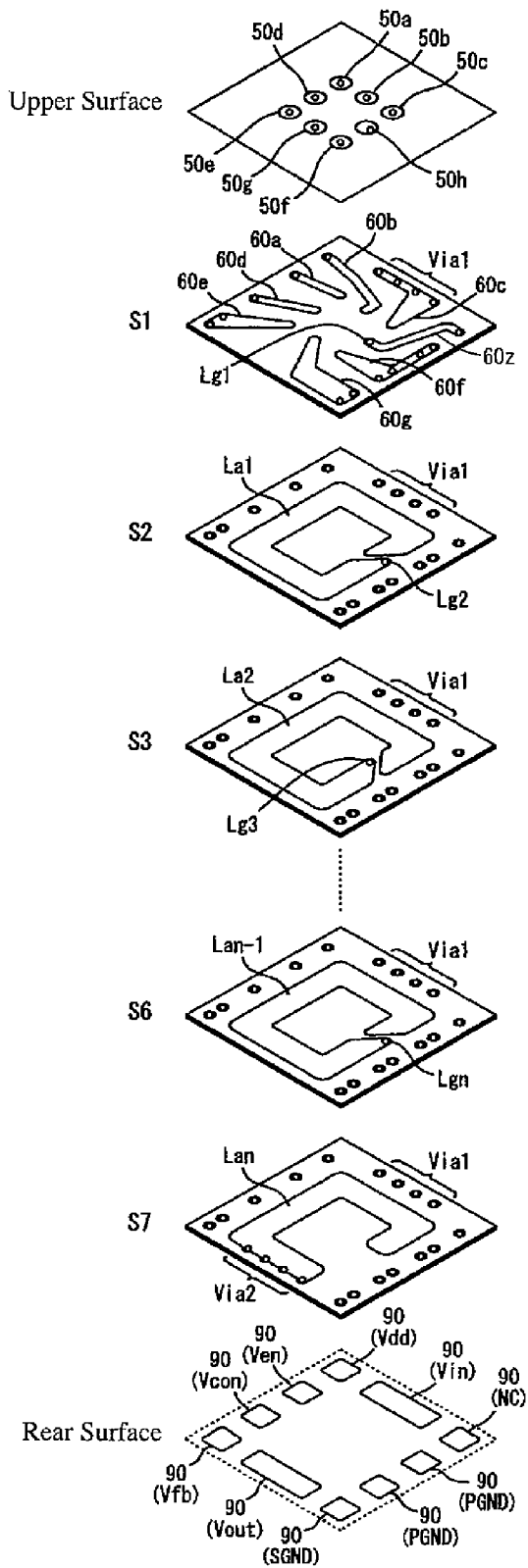
FIG. 23 is a partially exploded perspective view showing a multi-layer, insulating substrate used in a DC-DC converter according to a still further embodiment of the present invention.
Figure 24:
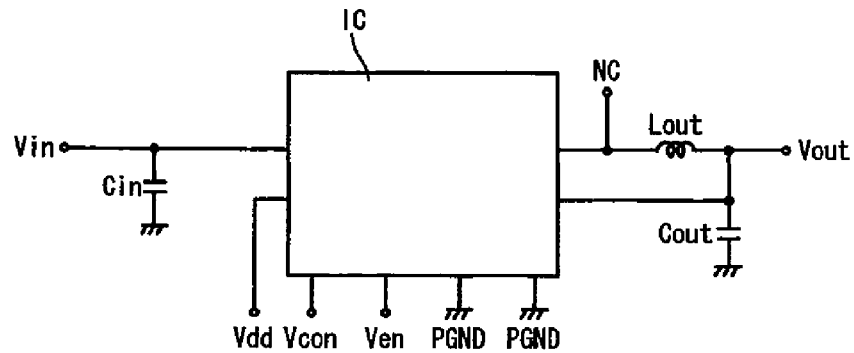
FIG. 24 is a view showing a DC-DC converter according to a further embodiment of the present invention.

FIG. 22 shows a DC-DC converter according to a still further embodiment of the present invention, FIG. 23 shows a multi-layer substrate used in the DC-DC converter, and FIG. 24 shows a DC-DC converter circuit. In this embodiment, part of first connecting wires are getting wider toward second connecting wires. The second connecting wires are formed by pluralities of via-holes to connect the first connecting wires to second external electrodes. Such structure reduces parasitic inductance, and efficiently dissipates heat generated by a semiconductor integrated circuit device. In this embodiment, a first external terminal 50h connected to one end of a laminated coil is connected to a second external terminal NC via a first connecting wire 60z, to facilitate the inductance measurement of the laminated coil. The second external terminal NC is not connected to a connecting line formed on a circuit board.

The size reduction of a multi-layer substrate likely permits noise from switch circuits to enter a control signal path via a ground, causing malfunction. To overcome this problem, a ground (for a power system) connected to a switching device SW2 and a ground (for a source system) of the control signal path are separated from each other, and connected to different second external terminals PGND, SGND in this embodiment. The DC-DC converter in this embodiment has excellent conversion efficiency despite its small size.

Insulating layers produced by an LTCC method, etc. are preferably made of soft ferrite having a Curie temperature of 100° C. or higher. The composition of such soft ferrite may be properly selected depending on the magnetic properties (initial permeability, loss, quality coefficient, etc.) required for inductors. It preferably comprises main components comprising 40-50 mol % of $Fe_2O_3$, 20-40 mol % of NiO, 10-20 mol % of CuO, 2-20 mol % of ZnO, and 0.3-7 mol % of $CO_3O_4$, and 4% by mass or less of $Bi_2O_3$ based on the total amount of the main components, meeting the conditions of $1 \leq NiO/CuO \leq 4$, $0.5 \leq CuO/ZnO \leq 10$, and $1 \leq NiO/ZnO \leq 20$ by a molar ratio. This soft ferrite is sinterable at 950° C. or lower, having a Curie temperature Tc of 120° C. or higher and initial permeability (frequency: 100 kHz) of 10 or more. Also, its complex permeability has a real part of 10 or more and an imaginary part of less than 5 in a frequency range of 1-200 MHz.

Such soft ferrite is blended with a binder, a plasticizer, a solvent, etc. to form a slurry, which is formed into green sheets by a doctor blade method. After bored by a laser, each sheet is screen-printed with a conductive paste (for instance, Ag: 100%) to form a coil pattern, a first external terminal pattern, a first connecting wire pattern, via-holes for second connecting wires, a second external terminal pattern, etc.

Ferrite used for the magnetic gap GP1 preferably has a Curie temperature Tc of −40° C. or lower. Because the Curie temperature Tc varies depending on the amounts of $Fe_2O_3$ and ZnO, main components of the ferrite, the amounts of $Fe_2O_3$ and ZnO are determined such that the Curie temperature becomes −40° C. or lower, taking into consideration matching in sintering shrinkage with ferrite for forming the insulating layer. Such ferrite for the magnetic gap GP1 includes Cu—Zn ferrite comprising 40-55 mol % of $Fe_2O_3$, and 40 mol % or more of ZnO, the balance being CuO, as main components, which has a Curie temperature of lower than −40° C., with no magnetism at room temperature. The printing of a paste of such ferrite provides the magnetic gap GP1.

The present invention will be explained in more detail with reference to Examples below without intention of restricting the scope of the present invention.

EXAMPLE 1 COMPARATIVE EXAMPLE 1

Production of DC-DC Converter having Structure Shown in FIGS. 1-5

Ferrite having a Curie temperature Tc of 140° C. and initial permeability of 25 at a frequency of 100 kHz, which comprised main components comprising 47.0 mol % of $Fe_2O_3$, 36.7 mol % of NiO, 11.0 mol % of CuO, 5.0 mol % of ZnO and 0.3 mol % of $CO_3O_4$, and 1.0% by mass of $Bi_2O_3$ per the total amount of the main components, was formed into sheets by an LTCC method, and each sheet was provided with a predetermined coil pattern by an Ag paste. Insulating layers were laminated such that a magnetic gap GP1 made of Cu—Zn ferrite (Curie temperature: −60° C.) comprising main components comprising 45.7 mol % of $Fe_2O_3$ and 4.0 mol % of ZnO, the balance being CuO, and 0.3% by mass of $Bi_2O_3$ per the total amount of the main components was formed on an insulating layer S2, pressure-bonded, and sintered to produce a mother board in which pluralities of multi-layer substrates each having a laminated coil having inductance of 3.3 μH were connected. After degreasing, the sintering was conducted in an electric furnace with an air atmosphere, with temperature elevation at 150° C./hr, keeping at 900° C. for 1 hour, and then temperature decrease at about 300° C./hr.

Conductor patterns formed by electric plating on an outer surface of the mother board were subjected to Ni—P plating and Au plating to form first external terminals. Connected to the first external terminals were a semiconductor-integrated circuit device IC, and capacitors Cin (10 μF), Cout (4.7 μF) by soldering. With a device-mounting surface sealed by an epoxy resin, the mother board was divided along dividing grooves given in advance, to obtain DC-DC converters of 4.5 mm×3.2 mm×1.4 mm.

When the multi-layer substrate was viewed from above, a region inside the laminated coil had an area of 4.2 $mm^2$, and a region outside the region had an area of 4.3 $mm^2$ A portion with the laminated coil was as thick as 0.3 mm, with an upper insulating layer region and a lower insulating layer region each having a thickness of 0.2 mm. The magnetic gap was 20 μm with an area of 2.1 $mm^2$. When the resultant DC-DC converter was operated to provide an output voltage Vo of 3.2 V from an input voltage V1 of 3.6 V, a voltage conversion efficiency of more than 95% was obtained when an output current Io was 150 mA.

A coil inductor (inductance: 3.3 μH) having a drum ferrite core was mounted on a printed circuit board together with the same semiconductor integrated circuit device IC and capacitors Cin, Cout as in Example 1, to produce a DC-DC converter of Comparative Example 1. Measurement under the same conditions as in Example 1 revealed that the DC-DC converter of Comparative Example 1 had substantially comparable voltage conversion efficiency of more than 95%.

However, the DC-DC converter of Example 1 comprising capacitance elements suffered little influence of parasitic inductance generated by the first and second connecting wires, etc., while exhibiting comparable voltage conversion efficiency to that of Comparative Example 1. The parasitic inductance in the DC-DC converter of Example 1 was less than about one-fifth in the DC-DC converter of Comparative Example 1. Such a terminal structure as LGA, etc. suppressing a magnetic flux from leaking from the inductor enabled the high-density mounting of other circuit elements near the DC-DC converter on the printed circuit board.

Figure 25:
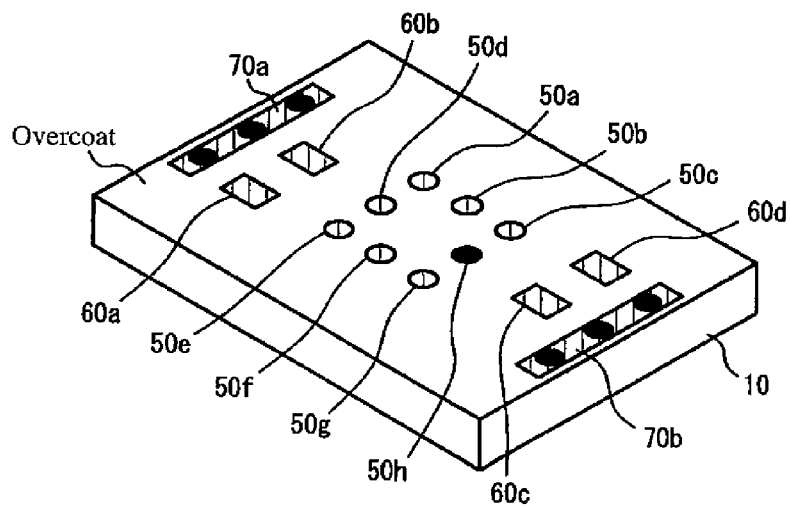
FIG. 25 is a perspective view showing a multi-layer, insulating substrate used in a DC-DC converter according to a still further embodiment of the present invention.

Although the DC-DC converter of the present invention has been explained above referring to the attached drawings, the present invention is not restricted to the depicted embodiments, but may be modified variously within the scope of the present invention. As shown in FIG. 25, for instance, the first main surface of the multi-layer substrate may be covered with an overcoat, and the first connecting wires may be formed on a layer near the first main surface in the multi-layer substrate. With such a structure, the elongation of the plating and short-circuiting by an excess solder can be prevented, even if the first connecting wires on the first main surface have narrow gaps. Also even large first external terminals would not interfere with the first connecting wires.

The use of the same insulating material as the multi-layer substrate for the overcoat is not preferable because it increases parasitic inductance. Thus, the overcoat is made of non-magnetic materials such as glass and dielectric materials, or low-permeability magnetic materials. The formation of the first external terminals and the first connecting wires on the overcoat is preferable because parasitic inductance generated by the first connecting wires can be further reduced.

Effect of the Invention

While being small, the DC-DC converter of the present invention integrally comprising a semiconductor integrated circuit IC and an inductor is excellent in the reduction of a magnetic flux leaking from the multi-layer substrate, the reduction of parasitic inductance, the heat dissipation of the semiconductor integrated circuit IC, etc.

What is claimed is:

1. A DC-DC converter comprising a soft-magnetic, multi-layer substrate provided with a laminated coil constituted by connecting pluralities of conductor lines, and a semiconductor integrated circuit device comprising a switching device and a control circuit, which are mounted on said soft-magnetic, multi-layer substrate,
   said semiconductor integrated circuit device comprising an input terminal, an output terminal, a first control terminal for controlling the ON/OFF of said switching device, a second control terminal for variably controlling output voltage, and ground terminals;
   said soft-magnetic, multi-layer substrate comprising first external terminals formed on a first main surface, second external terminals formed on a second main surface, and connecting wires connecting said first external terminals and said second external terminals;
   terminals of said semiconductor integrated circuit device being connected to said first external terminals on said soft-magnetic, multi-layer substrate;
   at least part of said first external terminals being electrically connected to said second external terminals through said connecting wires; and
   said output terminal of said semiconductor integrated circuit device being connected to said second external terminal via said laminated coil, and being connected to other said second external terminal via said connecting wires.

2. The DC-DC converter according to claim 1, wherein said connecting wires are formed by electrodes on the surface of said soft-magnetic, multi-layer substrate and/or in said soft-magnetic, multi-layer substrate.

3. The DC-DC converter according to claim 1, wherein said semiconductor integrated circuit device has a negative feedback terminal, and wherein said first external terminal connected to said negative feedback terminal is connected to the other end of the laminated coil connected to said output terminal.

4. The DC-DC converter according to claim 1, wherein capacitance elements are connected to said first external terminals formed on the first main surface of said multi-layer substrate, and wherein said input and/or output terminals of said semiconductor integrated circuit device are connected to the ground terminals via said capacitance elements.

5. A DC-DC converter comprising a soft-magnetic, multi-layer substrate provided with a laminated coil constituted by connecting pluralities of conductor lines, and a semiconductor integrated circuit device comprising a switching device and a control circuit, which are mounted on said soft-magnetic, multi-layer substrate, said semiconductor integrated circuit device comprising an input terminal, an output terminal, a first control terminal for controlling the ON/OFF of said switching device, a second control terminal for variably controlling output voltage, a ground connected to said switching device, and a ground of the control signal path;

said soft-magnetic, multi-layer substrate comprising first external terminals formed on a first main surface, second external terminals formed on a second main surface, and connecting wires connecting said first external terminals and said second external terminals;

terminals of said semiconductor integrated circuit device being connected to said first external terminals on said soft-magnetic, multi-layer substrate;

at least part of said first external terminals being electrically connected to said second external terminals through said connecting wires;

said input or output terminal of said semiconductor integrated circuit device being connected to said second external terminals via said laminated coil; and said ground connected to said switching device and said ground of the control signal path being connected to different second external terminals.

6. The DC-DC converter according to claim 2, wherein said connecting wires are formed by electrodes on the surface of said soft-magnetic, multi-layer substrate and/or in said soft-magnetic, multi-layer substrate.

7. The DC-DC converter according to claim 2, wherein said semiconductor integrated circuit device has a negative feedback terminal, and wherein said first external terminal connected to said negative feedback terminal is connected to the other end of the laminated coil connected to said output terminal.

8. The DC-DC converter according to claim 2, wherein capacitance elements are connected to said first external terminals formed on the first main surface of said multi-layer substrate, and wherein said input and/or output terminals of said semiconductor integrated circuit device are connected to the ground terminals via said capacitance elements.

* * * * *